United States Patent
Sakabe et al.

(10) Patent No.: US 10,338,148 B2
(45) Date of Patent: Jul. 2, 2019

(54) COMMUNICATION DEVICE AND COMMUNICATION SYSTEM

(71) Applicant: Hitachi, Ltd., Chiyoda-ku, Tokyo (JP)

(72) Inventors: Kei Sakabe, Tokyo (JP); Takanori Yamazoe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 402 days.

(21) Appl. No.: 15/112,607

(22) PCT Filed: Mar. 26, 2014

(86) PCT No.: PCT/JP2014/058569
§ 371 (c)(1),
(2) Date: Jul. 19, 2016

(87) PCT Pub. No.: WO2015/145622
PCT Pub. Date: Oct. 1, 2015

(65) Prior Publication Data
US 2016/0341797 A1 Nov. 24, 2016

(51) Int. Cl.
*G01R 31/396* (2019.01)
*G01R 31/382* (2019.01)
(Continued)

(52) U.S. Cl.
CPC ........... *G01R 31/382* (2019.01); *G01R 31/36* (2013.01); *G01R 31/44* (2013.01); *G08C 15/06* (2013.01);
(Continued)

(58) Field of Classification Search
CPC ...... G01R 31/3606; G08C 15/06; H04Q 9/00; H04Q 2209/40; H04Q 2209/886; H04Q 2209/84
(Continued)

(56) References Cited

U.S. PATENT DOCUMENTS

| 4,709,339 A | * | 11/1987 | Fernandes | ............... G01K 1/024 324/127 |
| 6,448,903 B1 | * | 9/2002 | Hattori | .................... B63B 59/02 340/870.01 |

(Continued)

FOREIGN PATENT DOCUMENTS

| EP | 0 959 335 A1 | 11/1999 |
| JP | 9-84270 A | 3/1997 |

(Continued)

OTHER PUBLICATIONS

International Search Report (PCT/ISA/210) issued in PCT Application No. PCT/JP2014/058569 dated Jul. 1, 2014 with English-language translation (four (4) pages).

(Continued)

*Primary Examiner* — Melissa J Koval
*Assistant Examiner* — Courtney G McDonnough
(74) *Attorney, Agent, or Firm* — Crowell & Moring LLP

(57) ABSTRACT

An object of the present invention is to provide a wireless communication technique which can measure a physical state of the measurement object with high accuracy and can transmit the measurement result rapidly. The communication device according to the present invention wirelessly transmits the measurement result during a first time slot, and starts measurement during a second time slot which differs from the first time slot (see FIG. 3).

5 Claims, 3 Drawing Sheets

(51) Int. Cl.
*G01R 31/36* (2019.01)
*G08C 15/06* (2006.01)
*H04Q 9/00* (2006.01)
*G01R 31/44* (2006.01)

(52) U.S. Cl.
CPC ........... *H04Q 9/00* (2013.01); *H04Q 2209/40* (2013.01); *H04Q 2209/84* (2013.01); *H04Q 2209/86* (2013.01); *H04Q 2209/886* (2013.01)

(58) Field of Classification Search
USPC ........................................................ 324/426
See application file for complete search history.

(56) References Cited

U.S. PATENT DOCUMENTS

2006/0208693 A1   9/2006   Emori et al.

2014/0278180 A1*  9/2014   Takeda .................... H04Q 9/00
                                                        702/89

FOREIGN PATENT DOCUMENTS

| | | |
|---|---|---|
| JP | 9-318478 A | 12/1997 |
| JP | 2006-260981 A | 9/2006 |
| JP | 2007-36342 A | 2/2007 |
| JP | 2010-271897 A | 12/2010 |
| JP | 2011-118727 A | 6/2011 |
| JP | 2012-65073 A | 3/2012 |
| WO | WO 2013/080304 A1 | 6/2013 |

OTHER PUBLICATIONS

Japanese-language International Preliminary Report on Patentability (PCT/IB/409) issued in PCT Application No. PCT/JP2014/058569 dated May 28, 2015 (three (3) pages).

* cited by examiner

COMMUNICATION DEVICE AND COMMUNICATION SYSTEM

TECHNICAL FIELD

Present invention relates to a technique for transmitting a measurement result related to the physical state of a measurement object using wireless communication.

BACKGROUND ART

In recent years, battery systems with built-in multiple batteries such as accumulation devices for mobile devices, Power System Stabilizer (PSS), and emergency batteries are attracting attentions. To elicit the performance of these systems, the parameters of the batteries such as state of charge (SOC), state of health (SOH), and maximum chargeable/dischargeable current (allowable charge/discharge current) should be calculated to control the operation of the battery based on the result. Further, the state of charge of each battery should be adjusted adequately.

To achieve these operations, each battery is attached with a battery voltage measurement circuit (cell controller), and a battery controller mounted with central processing unit (CPU) performs the calculation or operation mentioned above based on information transmitted from the cell controller. To perform this calculation with good accuracy, the battery voltage and battery current should be measured with high accuracy. Further, the measurement timings between the voltage and batteries should be close enough because SOC and SOH of the batteries are calculated using correlation between the current and voltage.

The number of communication lines connecting the cell controllers and battery controllers increases if the number of the batteries that are built inside the battery system increases. The manufacturing cost required for wire connections increases as well. Therefore, one idea is to use wireless communication. In such case, an ultrasonic communication method described in PTL 1 below can be contemplated as a communication procedure.

Enormous numbers of communication lines connecting the cell controllers and the battery controllers, can be omitted by allocating a slot for permitting communications to each cell controller and by performing the measurements and communications within this slot as described in PTL 1. This communication shall be at high speed to guarantee a real time calculation.

CITATION LIST

Patent Literature

PTL 1: JP Patent Publication (Kokai) 2012-065073 A

SUMMARY OF INVENTION

Technical Problem

The time required for a precise measurement is generally longer compared to low accuracy measurement. Thus, as described in the communication method of PTL 1, slot should be long enough conforming to the required measurement time in order to complete the operations of measuring and receiving the result in the allocated slot. However, the traffic per time, which is a substantial communication speed, is lowered if the slot is lengthened. Therefore, the communication method described in PTL 1 may be difficult to accomplish both precise measurement and high communication speed at once.

Further, the calculation accuracies of SOC and SOH of the batteries is degraded if each cell controller measures independently in their allocated slot as described in the communication method of PTL 1 because the measurement timings become inconsistent.

The present invention is made in view of the above problems, and an object of an invention is to provide a wireless communication technique which can measure the physical state of a measurement object with high accuracy and can transmit the measurement result rapidly.

Solution to Problem

A communication device according to the present invention wirelessly transmits a measurement result during a first time slot, and starts measurement during a second time slot which differs from the first time slot.

Advantageous Effects of Invention

The communication device of the present invention allows both a precise measurement which generally requires time, and a high substantial communication speed.

DESCRIPTION OF EMBODIMENTS

Figure 1:
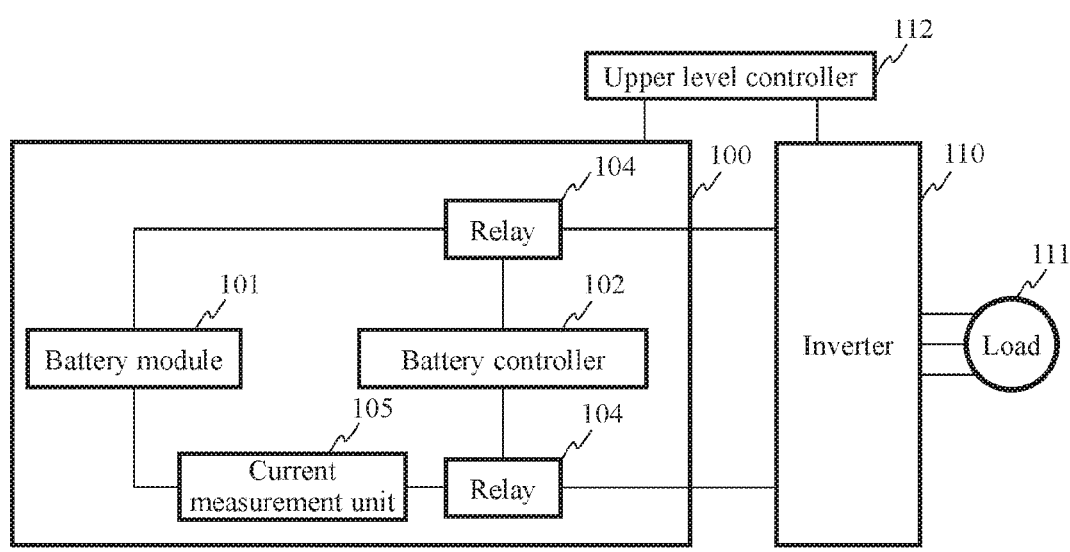
FIG. 1 illustrates a configuration of a battery system 100 and the peripherals thereof.

FIG. 1 illustrates a configuration of a battery system 100 (communication system) of the present invention and the peripherals thereof. The output voltage of battery system 100 may not be adequate sometimes for supplying an electric power directly to a load 111 because the voltage is direct current voltage which fluctuates according to the residual capacity of batteries or the output current. The output voltage of the battery system 100 is therefore converted to a three phase alternating current using an inverter 110 which is controlled by an upper level controller 112, and then is supplied to the load 111. A similar configuration can be applied for supplying the load 111 with direct current voltage, other multi-phase alternating current, and single phase alternating current. When the load 111 outputs an electric power, the electric power outputted from the load 111 can be accumulated to the battery system 100 using the inverter 110 as a bi-directional inverter. The battery system 100 can be charged as necessity by connecting the charging system with the battery system 100 in parallel to the inverter 110.

The battery system 100 transmits to the upper level controller 112 battery state information such as state of charge (SOC) or state of health (SOH) of the battery, maximum charge current or discharge current (allowable charge/discharge current), battery temperature, and the presence of abnormalities of the battery. The upper level controller 112 performs energy management or abnormality detection based on these information. For example, when the battery system 100 is determined to be separated from the inverter 110 or the load 111 based on the abnormality detection result, the upper level controller 112 transmits a disconnection direction to the battery system 100. The battery system 100 operates a relay 104 according to this direction, and separates electrically the inverter 110 or the load 111.

Figure 2:
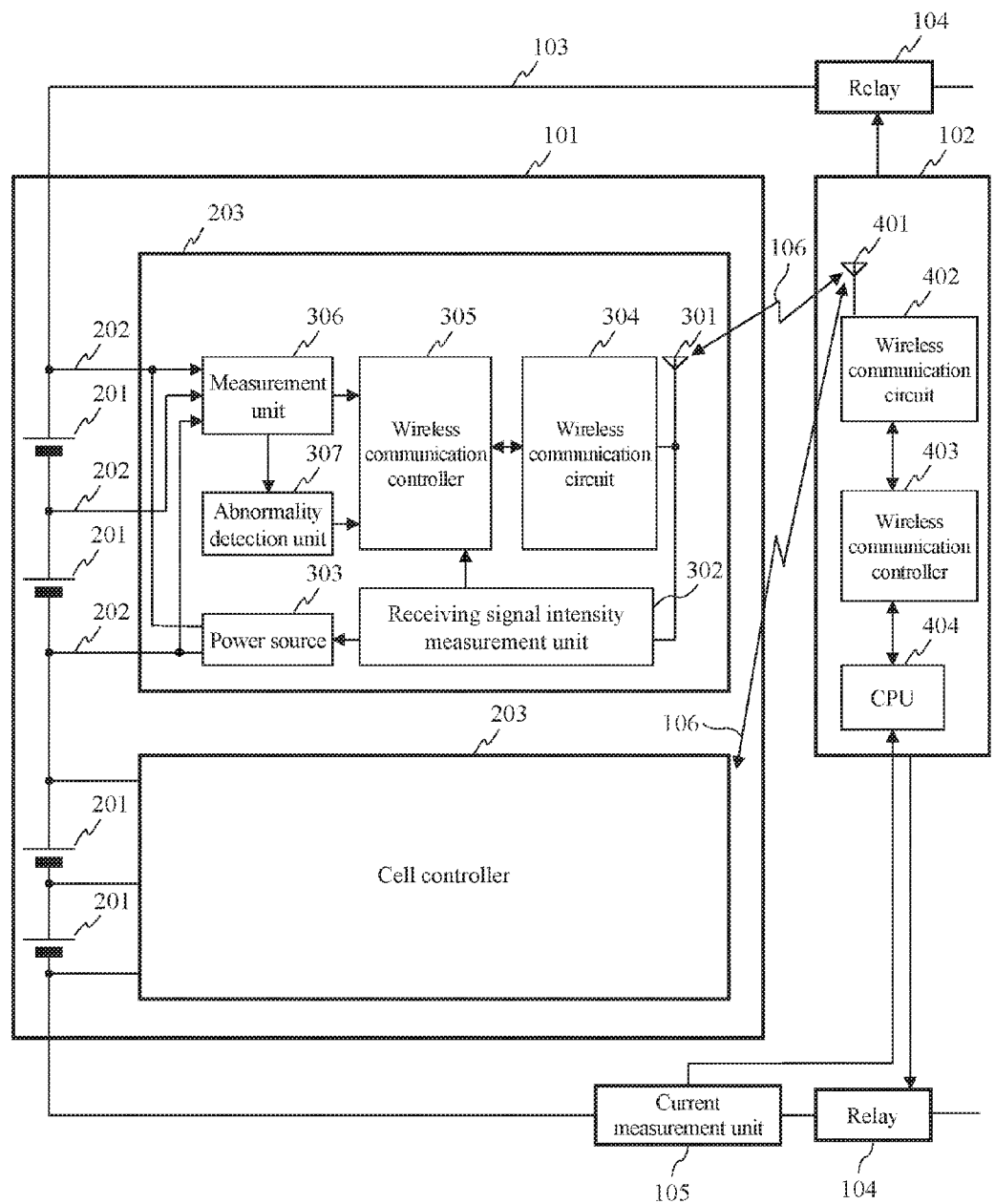
FIG. 2 illustrates a detail of the battery system 100.

FIG. 2 illustrates a detail of the battery system 100. The battery system 100 includes: one or more battery modules 101; a battery controller 102 which monitors, estimates, or controls the state of the battery system 100; a relay 104 which intermits the output of the battery system 100; and a current measurement unit 105 which measures the current flowing into the battery.

The battery module 101 includes one or more unit batteries 201 and one or more cell controllers 203 (communication device). The cell controller 203 measures the temperature inside the battery module 101 or the output voltage of each unit battery 201, and performs charge/discharge for each unit battery 201 as necessity. The monitoring and adjustment of the voltage of each unit battery 201 are thereby become possible, and this allows an estimation of the battery states when the characteristics of the battery changes according to the temperature.

The current measurement unit 105 and the relay 104 are connected serially to the battery module 101 via the power line 103. The current measurement unit 105 measures a current value that is necessary for monitoring and estimating the state of the battery module 101. The relay 104 intermits the output of the battery system 100 according to the instructions of the upper level controller 112. When multiple battery modules 101 are connected in parallel, relays 104 and current measurement units 105 can be arranged in each row. Relays 104 and current measurement units 105 may be arranged only in the output unit of the battery system 100. Relays 104 and current measurement units 105 can be arranged in both of each row and output units of the battery system 100.

The relay 104 can be configured by a single relay or by a set of main relay, pre-charge relay, and resistance. In the latter case, the pre-charge relay and the resistance are connected serially and then they are connected parallel to the main relay. The pre-charge relay is connected first during the connection of the relay 104. The inrush current which may arise in the former case can be restricted because the current flowing through the pre-charge relay is restricted by the resistance connected in series. The main relay is connected after the current flowing through the pre-charge relay becomes small enough. The timing of the main relay connection can be determined based on the current flowing the pre-charge relay, the voltage over the resistance, the inter-terminal voltage of the main relay, or the time elapsed from the connection of the pre-charge relay.

The measured value of the battery module 101 and the measured value of the current measurement unit 105 are transmitted to the battery controller 102. The battery controller 102 performs state monitoring, state estimation, and controls of the battery based on the measured values. The controls here mean, for example, the operations such as charge/discharge of every unit battery 201 for equalizing the voltage of each unit battery 201, power source controls of each sensor, addressing of the sensors, and controls of the relay 104 which is connected to the battery controller 102.

The battery system 100 can be equipped with a fan for system cooling, and the battery controller 102 may control this fan. The cooling control of the battery system 100 allows reducing the traffic between the battery system 100 and the upper level controller 112.

The cell controller 203 is connected with one or more unit batteries 201 via the voltage detection line 202. The cell controller 203 includes a receiving signal intensity measurement unit 302, a power source 303, a wireless communication circuit 304, a wireless communication controller 305, a measurement unit 306, and an abnormality detection unit 307.

The measurement unit 306 measures the physical states such as battery voltage and temperature of each unit battery 201 according to the directions from the wireless communication controller 305. This measurement result is transmitted to the wireless communication controller 305 and the abnormality detection unit 307.

The abnormality detection unit 307 detects the presence of the abnormalities of the unit battery 201 or the cell controller 203 based on the measurement result received from the measurement unit 306 or an internal state of the cell controller 203, and then transmits the detection result to the wireless communication controller 305. The abnormalities of the unit battery 201 detected by the abnormality detection unit 307 are, for example, over-charge, over-discharge, and over-temperature. The abnormalities of the cell controller 203 detected by the abnormality detection unit 307 are, for example, abnormalities of the measurement unit 306, abnormalities of the abnormality detection unit 307 itself. The abnormalities can be detected rapidly because they are detected inside the cell controller 203.

The wireless communication controller 305 is a functional unit that controls an operation of the wireless communication circuit 304, and transmits the measurement results or detection results received from the measurement unit 306 or the abnormality detection unit 307 to the battery controller 102 via the wireless communication circuit 304 using the wireless communication 106. The detailed control method will be described later. The wireless communication controller 305 determines a frequency channel to be utilized based on the received electric wave intensity measured by the receiving signal intensity measurement unit 302, for example. The measurement results are thereby transmitted at the adequate timing where the communication abnormalities hardly occur.

The wireless communication circuit 301 is connected to the antenna 301, and transmits/receives electric waves between the battery controllers 102. The wireless communication circuit 301 includes either one or both of a circuit for controlling the reflective intensity of the electric wave and a circuit for transmitting the electric wave, for example, and a passive type or an active type wireless communication is performed using these circuits. When the circuit for controlling the reflective intensity of the electric wave is used, the power consumption of the wireless communication can be reduced. When the circuit for transmitting the electric wave is used, the wireless communication signal is intensified to improve the noise tolerance, and the communicable distance can be lengthened.

The antenna 301 is a unit for transmitting and receiving electric waves, and has a size suitable for frequency band utilized in communications. The antenna 301 of chip type is used when downsizing is required. A circuit pattern provided on a substrate surface is used as the antenna 301 when cost reduction and slimming down are required.

The receiving signal intensity measurement unit 302 measures the signal intensity of the electric wave received by the antenna 301. The signal intensity value is transmitted to the wireless communication controller 305 or the power source 303.

The power source 303 supplies an electric power to each circuit inside the cell controller 203. The power source 303 itself uses the unit battery 201 or the electric waves received by the antenna 301 as its power source. FIG. 2 illustrates an example where the unit battery 201 is used as the power source. The power source 303 can restrict an output as necessity because the power consumption is increased if the electric power is supplied continuously to each circuit inside the cell controller 203. The power source 303 begins an output when the signal intensity outputted from the receiving signal intensity measurement unit 302 exceeds a predetermined value, determining that the wireless communication signal is received. This output is terminated when the wireless communication controller 305 outputs a signal indicating the completion of the communication. The output can thereby be restricted.

The battery controller 102 is a circuit which wirelessly communicates with each cell controller 203, and controls their operation. The battery controller 102 includes an antenna 401, a wireless communication circuit 402, a wireless communication controller 403, and a CPU 404.

The antenna 401 is a unit for transmitting and receiving electric waves, and has the size suitable for frequency band utilized in the communication. The antenna 401 of chip type is used when downsizing is required. Circuit pattern provided on a substrate face is used as the antenna 401 when cost reduction and slimming down are required. The antenna 401 of stick type is used, for example, when a large transmission output or high receiving sensitivity are required. The antenna 401 transmits/receives the wireless electric waves between the antenna 301 equipped in the cell controller 203.

The wireless communication circuit 402 is connected to the antenna 401 and has a transmitting circuit and a receiving circuit for transmitting/receiving the electric waves through this antenna. The wireless communication controller 403 is a functional unit which controls an operation of the wireless communication circuit 402, and wirelessly communicates with the cell controller 203 via the wireless communication circuit 402. The communication procedure will be discussed later.

The CPU 404 acquires the information related to the state of the battery module 101 via wireless communication controller 403, estimates the states of the battery such as SOC and SOH, controls the battery system 100 based on the abnormality information, and transmits information related to the state of the battery module 101 to the upper level controller 112 when necessary. The CPU 404 can also perform the similar controls based on the measurement result of the current measurement unit 105.

The wireless communication circuits 304 and 402 communicate using 2.4 GHz band or ultra high frequency (UHF) band. This allows an operation of the battery system 100 in many countries. Since these frequency bands are used by other devices, interferences are likely to occur. The wireless communication controller 305 and 403 therefore may perform countermeasure processes for interferences such as frequency hopping.

Figure 3:
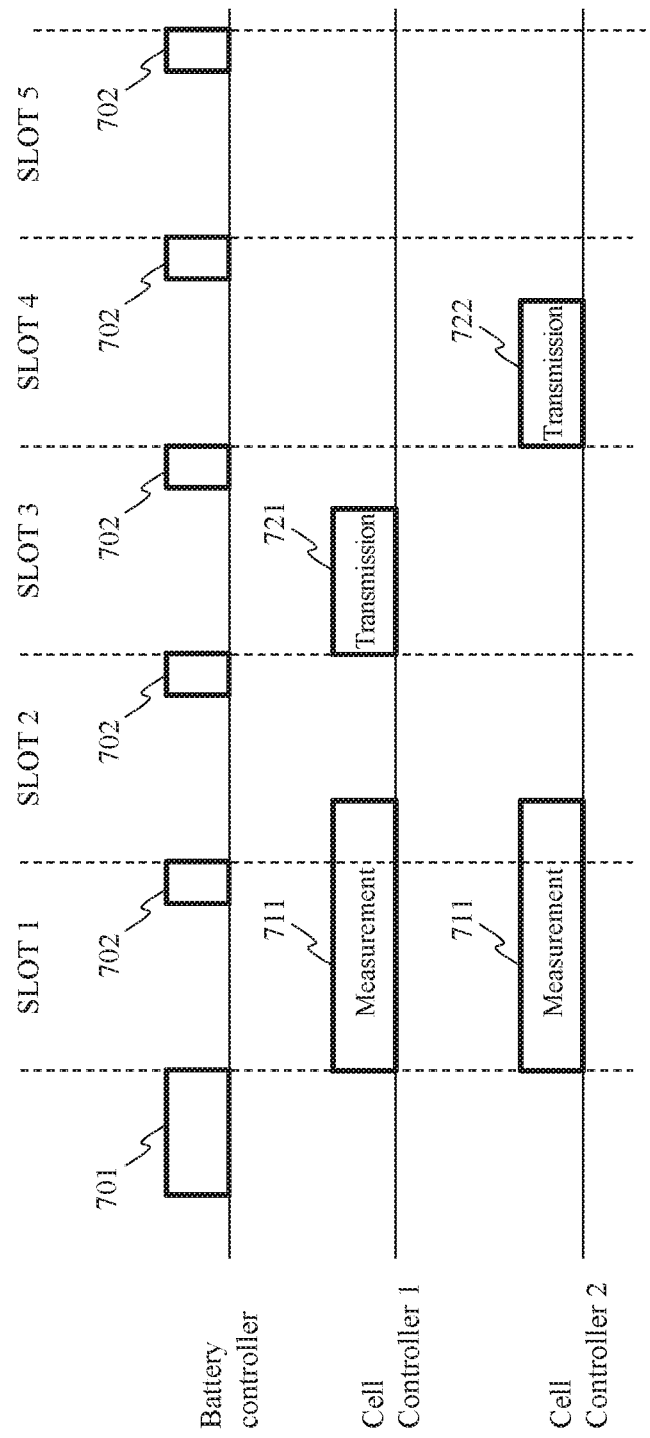
FIG. 3 is a timing chart for illustrating a wireless communication operation of battery controller 102 between two cell controllers 203.

FIG. 3 is a timing chart illustrating a wireless communication operation of the battery controller 102 between two cell controllers 203. The operations of wireless communication controller 305 and 403 will be discussed below according to FIG. 3.

The battery controller 102 and the cell controller 203 communicate using time division wireless communication. The battery controller 102 allocates a communicable time (will be referred as "slot" hereafter) to each cell controller 203, and each cell controller 203 wirelessly communicates with the battery controller 102 in the slot allocated to each controller. Each cell controller 203 can predict the timing for performing the communication because the lengths of each slot are constant. Each cell controller 203 can thereby start only at the timing for performing the communication, and allows reducing the power consumption.

The wireless communication between the battery controller 102 and each cell controller 203 begins when the battery controller 102 transmits the beacon 701. Each cell controller 203 recognizes that a first slot (slot 1) begins when the beacon 701 is received.

The beacon 701 includes the commands for directing the operations each cell controller 203 should perform, and each cell controller 203 performs the operation within the slot allocated to themselves.

The battery controller 102 transmits a signal 702 periodically after the transmission of the beacon 701, and notifies each cell controller 203 that the next slot has begun. Upon receiving the signal 702, the wireless communication controller 305 of each cell controller 203 performs an operation directed by the beacon 701 if the present slot is a slot allocated to itself. For example, the startup of the internal circuit of the cell controller 203 or a transmission process 721 are performed. The performance of the transmission process 721 in the different timings by each cell controller allows avoiding the communication collisions.

Each cell controller 203 can perform the process in a slot that differs from the slot allocated to itself depending on a command included in the beacon 701. In the example shown in FIG. 3, the measurement unit 306 of each cell controller 203 performs a measurement process 711 in the slot 1 according to the directions from the wireless communication controller 305. Length of each slot can be shortened by performing an operation such as measurement process 711 that does not arise impropriety even when each cell controller 203 performs simultaneously, and a process such as transmission process 721 which arises impropriety such as communication collision when each cell controller 203 performs simultaneously in different slots. The effective transmission speed is thereby improved and real-time calculation in the battery controller 102 is improved.

The simultaneity of the measurement is improved by performing the measurement processes 711 of each cell controller 203 in the same slot. This decreases the timing gap of the measurements between the current measurement unit 105 and the measurement unit 306. The calculation accuracies of the battery states such as SOC and SOH are thereby improved.

The slot allocations for each cell controller 203 can be stored as fixed values at a nonvolatile memory in the cell controller 203, for example at the time of shipment of the battery system 100. The battery controller 102 can direct slot allocations of each cell controller 203, for example using the beacon 701.

The slot allocations can be changed according to the start timing of the process where each cell controller 203 performs simultaneously, or the required time of such process. For example, if the measurement process 711 starts at a slot 1 and the required time is 1.2 slots as shown in FIG. 3, a slot 3 is allocated for the transmission process 711 of a cell controller 1, and a slot 4 is allocated for the transmission process 711 of a cell controller 2. The number of the slots are thereby optimized and the communication period between each cell controller 203 and the battery controller 102 can be shortened. The alteration of the slot allocations can be determined, for example, by the wireless communication controller 305 of each cell controller 203, or can be directed by the battery controller 102 using the beacon 701.

The slot allocations for each cell controller 203 can be determined by each cell controller 203 randomly, for example, when the beacon 701 is received. In this case, the communications may collide each other; however, this communication collision is avoidable in the succeeding periods by changing again the slot allocation randomly in the next communication period using the beacon 701. This random determination of the slot allocation allows an efficient setting of the slot allocation for exhibiting the advantage of the present invention, for example, even at so-called storage warehouse where many cell controllers 203 exist miscellaneously.

The allocating slot numbers can be limited even when the slots are allocated randomly according to the timing each cell controller 203 execute their processes simultaneously, or according to the required time of the process. For example, if there is an existing process which starts from the slot 1 and requiring 1.2 slots, the slot number larger than 3 is allocated for the other processes. The competition can thereby be avoided between the slots that are randomly allocated and the slots that are allocated for other processes.

CONCLUSION OF THE PRESENT INVENTION

As discussed above, the slot for start measuring the physical state of the unit battery 201 and the slot for wirelessly transmitting the measurement result differs each other in the cell controller 203 of the present invention. The wireless communication controller 305 can thus wirelessly transmit the measurement result without being limited by the measurement time required by the measurement unit 306. Therefore, the execution communication efficiency can be improved by shortening the slot length for transmitting the measurement result, while avoiding the communication collisions between the cell controllers 203.

According to the battery system 100 of the present invention, each cell controller 203 can start the measurement process 711 in the same slot. The measurement unit 306 can therefore coincide the timings for measuring the battery voltages between cell controllers 203, and can improve the calculation accuracies of SOC and SOH.

The present invention is not limited to the above mentioned embodiments, and includes various modifications. The above mentioned embodiments are discussed in detail in order to explain the present invention plainly, and the present invention is not necessarily limited to those including all configurations discussed above. For example, an implement for measuring the physical state of a battery and transmitting wirelessly is discussed in the above embodiment; however, the present invention can be applied to a communication system which measures the physical state of the other measurement objects and transmits wirelessly.

Each configuration, function, processing unit, processing means, and portion thereof discussed above can be achieved using hardware by those designed with integrated circuits, for example. Each configuration and function can be achieved by software using a processor which interprets and executes the programs for achieving each function. The information such as program, table, and files for achieving each function can be stored in recording devices such as memories, hard disks, and SSDs (Solid State Drive), or in recording mediums such as IC cards, SD cards and DVDs.

REFERENCE SIGNS LIST

100 battery system
101 battery module
102 battery controller
103 power line
104 relay
105 current measurement unit
106 wireless communication
110 inverter
111 load
112 upper level controller
201 unit battery
202 voltage detection line
203 cell controller
301 antenna
302 receiving signal intensity measurement unit
303 power source
304 wireless communication circuit
305 wireless communication controller
306 measurement unit
307 abnormality detection unit
401 antenna
402 wireless communication circuit
403 wireless communication controller
404 CPU

The invention claimed is:

1. A communication system comprising:
a first communication device and a second communication device, both of which include a measurement unit that measures a physical state of a measurement object; and a wireless communication unit that transmits a measurement result of the measurement unit using time division wireless communication, wherein the wireless communication unit transmits the measurement result using wireless communication during a first time slot in the time division wireless communication which is allocated beforehand, and wherein the measurement unit starts an operation for measuring the physical state of the measurement object during a second time slot which differs from the first time slot in the time division wireless communication; and
a controller that wirelessly communicates with the first and second communication devices,
wherein the controller transmits, using wireless communication, a signal for allocating the first time slot and a transmission instruction for directing the transmission of the measurement result during the allocated first time slot to each of the first and second communication devices,
wherein the first and second communication devices transmit the measurement results to the controller using wireless communication during the first time slot according to the transmission instruction,
wherein the controller transmits, using wireless communication, a signal for allocating the second time slot that differs from the first time slot and a measurement instruction for directing the measurement of the physical state of the measurement object in the allocated second time slot to each of the first and second communication devices,
wherein the first and second communication devices start operations for measuring the physical states of the measurement objects during the second time slot according to the measurement instruction,
wherein the controller allocates the second time slots that overlap each other in timing for the first and second communication devices, and wherein the first and second communication devices measure the physical states of the measurement objects concurrently according to the second time slot allocated from the controller.

2. The communication system as claimed in claim 1, wherein the measurement unit and the wireless communication unit receive electric power from electromagnetic waves in the environment, and operate using the electric power as a power source.

3. The communication system as claimed in claim 2, wherein the wireless communication unit receives an instruction for directing the transmission of the measurement result related to the physical state of the measurement object using wireless communication, and directs the measurement unit to start measuring the physical state of the measurement object according to the direction, wherein the measurement unit starts the operation for measuring the physical state of the measurement object according to the direction from the wireless communication unit, and wherein the measurement unit and the wireless communication unit operate using electromagnetic waves of the wireless communication as a power source when the wireless communication unit received the instruction.

4. The communication system as claimed in claim 1, wherein the measurement unit and the wireless communication unit receive electric power from the measurement object and operate using the electric power as a power source.

5. The communication system as claimed in claim 1, wherein the measurement object is a battery.

* * * * *